May 18, 1965 D. J. HEALEY III 3,184,682

LOW NOISE FREQUENCY CHANGING CIRCUIT

Filed Aug. 3, 1962

INVENTOR.
Daniel J. Healey, III
BY
H. H. Lock
Att'ys.

United States Patent Office 3,184,682
Patented May 18, 1965

3,184,682

LOW NOISE FREQUENCY CHANGING CIRCUIT

Daniel J. Healey III, Cockeysville, Md., assignor, by mesne assignments, to the United States of America as represented by the Secretary of the Navy Filed Aug. 3, 1962, Ser. No. 214,774
4 Claims. (Cl. 325—435)

Figure 1:
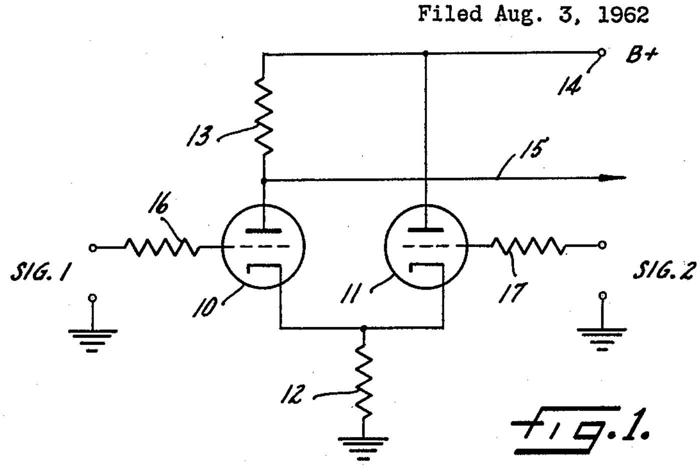

This invention relates to frequency changing circuits and more particularly to frequency changing circuits utilizing twin triode emission components with circuit arrangements to minimize electron emission noise or shot effects of the electron emission elements.

In the use of radio and radar electronic receiving devices two sources of noise are reckoned with, the noise received through the antenna and the noise produced by the electronic receiving equipment itself. This internal noise source is produced, for the most part, by resistors, vacuum tubes, semiconductors, and other electronic elements which noise is caused by random variations in the emission of electrons. In the use of vacuum tube elements, this random emission is often referred to as "shot effects" and is subject to amplification in the same manner as desired signals. In the design of radio and radar electronic receiving equipment a compromise is required in the gain and noise figures. The voltage gain that can be introduced ahead of frequency changers or mixers must be kept small to reduce high order intermodulation products. When this is done the noise figure of the frequency changing circuit becomes a limitation on performance. It has been found by experience, and is well set out in various texts, that triode tubes produce less fluctuation noises or shot effects than do pentodes or other multigrid tubes often used in frequency changers and mixers, and therefore the triode has become more useful in the development of frequency changers or mixer circuits, as well as in the development of amplifier circuits. One particular configuration of a frequency changer or mixer circuit is in the use of twin triode tube components or dual triode tubes resulting in higher conversion gain and less signal circuit loading than can be accomplished with the simple triode tube.

In the present invention this twin or dual triode tube configuration is used with additional circuitry to produce an out-of-phase mixer signal current equal to that flowing through the cathode-grid inherent capacitance to be applied to the signal grid circuit impedance to help nullify or minimize the shot effect noise produced in the tube components. The result is that the effective noise of the mixer signal appearing at the signal grid of the frequency changer or mixer twin triode circuit is greatly attenuated and the conversion gain is increased. This is accomplished in the twin or dual triode tube circuit where the intelligence signal is applied to the grid of the first of the triode tubes and the mixer signal or local oscillator signal is applied to the grid of the other triode tube acting as a cathode follower by placing an anode load resistance in the anode of the cathode follower tube and by coupling the anode of the cathde follwer to the grid of the first signal mixer triode tube. This additional structure provides for the out-of-phase coupling of the cathode follower to the signal mixer tube by way of the capacitive coupling and the comon coupling of the cathodes. In this circuit arrangement a noise reduction of 6 decibels was obtained and allowed the realization of low noise figure and wide dynamic range at low intermediate frequencies together with adequate adjacent channel decoupling when a plurality of multiplexed frequency changers or mixers were excited from a single local oscillator source. It is therefore a general object of this invention to provide a frequency changing circuit or mixer circuit which minimizes the effects of internal noise by shot effects or other emission noise of the electron components in the frequency changer or mixer circuit of the receiver.

Figure 2:
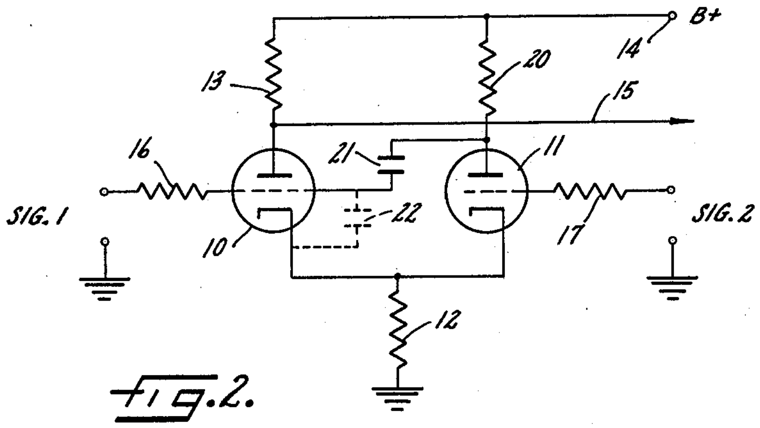
Figure 3:
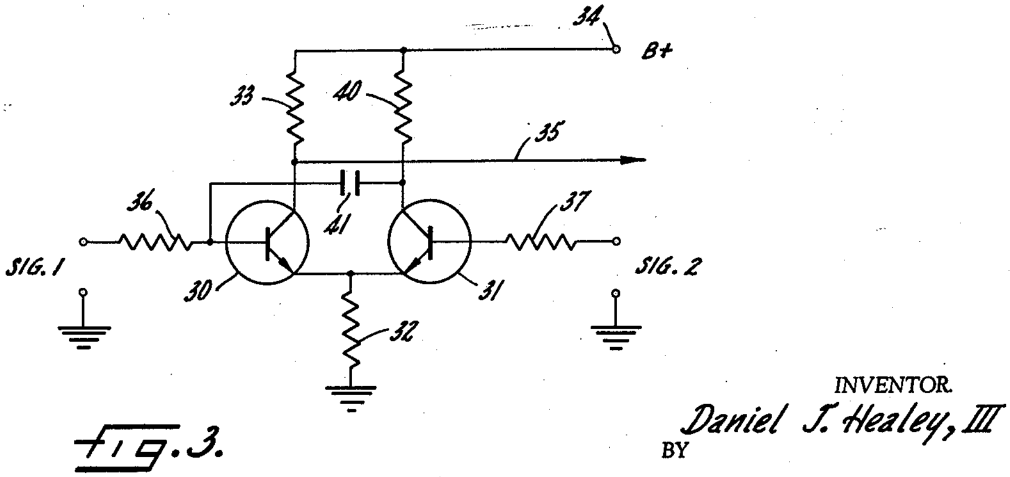

These and other objects and the attendant advantages, features, and uses will become more apparent to those skilled in the art as the description proceeds when considered along with the accompanying drawing illustrating preferred embodiments for the invention in which:

FIGURE 1 is a circuit diagram of a conventional twin triode frequency changer or mixer circuit, FIGURE 2 is the circuit of FIGURE 1 modified in accordance with this invention to produce the minimization of internal electron emission noise, and FIGURE 3 is a circuit schematic comparable to that shown in FIGURE 2 but using semiconductors for low voltage circuits.

Referring more particularly to FIGURE 1, a pair of triode vacuum tubes 10 and 11 are cathode coupled through a common cathode load resistor 12 to one pole of a direct current voltage source herein illustrated as being the ground pole. The pair of triodes 10 and 11 may consist of a twin triode tube where the tube characteristics of each triode component are such that there would be no interference between the electron emission circuits in the two tube components. Because dual triodes or a twin triode could be used interchangeably in this circuit, the triode sections will be referred to herein as components. The anode of the triode tube component 10 is coupled through an anode load resistor 13 to the other pole of the direct current voltage source represented by the tap 14 which is indicated herein as being the B+ voltage source. The anode of the triode tube component 11 is directly coupled to this B+ voltage source. The anode of the triode tube component 10 is coupled to an output conductor 15 on which the changed frequency is conducted, as to intermediate frequency (IF) circuits where the frequency changer of FIGURE 1 is used as a mixer, or the like. Signal number 1 is coupled to the grid of the triode tube component 10 and signal number 2 is coupled to the grid of the triode tube component 11. The resistance 16 is indicative of the source impedance of signal number 1 and the resistance 17 is indicative of the source impedance of signal number 2. The triode tube component 11 operates as a cathode follower which introduces the signal number 2 frequency to the frequency changing triode tube component 10 by virtue of the common cathode coupling. For example, signal number 2 may be from a local oscillator and signal number 1 may be the radio frequency (RF) signal to produce IF on the output 15. As may be readily realized, the production of internal noise is mixed with the signal number 1 frequency, or RF frequency, and conducted over the output 15 in its changed or mixed form, as IF, for example.

Referring more particularly to FIGURE 2, the basic circuit combination is used and like elements thereof are identified by like reference characters to those applied in FIGURE 1. In accordance with the invention in FIGURE 2, an anode load resistor 20 is connected between the anode of the triode tube component 11 and the B+ voltage supply 14 and a capacitor 21 couples the anode of the triode tube component 11 and the grid of the triode tube component 10. The capacitance of the capacitor 21 is made to be approximately equal (or the capacitor 21 may be adjustable and adjusted to be approximately equal) to the inherent capacitance between the cathode and grid of the triode tube component 10 which inherent capacitance is shown in dotted lines at 22. In the original circuit as shown in FIGURE 1, when driven from a high impedance network at the signal frequency input, noise sidebands of the signal number 2, such as those coming from a local oscillator appearing at the input signal grid of the triode tube component 10 by way of the cathode-grid capacitance of tube component 10, resulted in excessive noise in the desired beat frequency signal spectrum. The addition of the resistance 20 and the capacitance 21 allows an out-of-phase signal number 2, as from a local oscillator signal current equal to that flowing through the inherent cathode grid capacitance 22, to be applied to the signal grid circuit impedance of triode tube component 10. This out-of-phase application of the noise component through the capacitive coupling 21 and the common cathode coupling to the triode tube component 10 produces a large amount of attenuation of this noise component between the cathode and grid of the triode tube component 10 thereby increasing the gain of the signal number 1, or the intelligence signal, to produce a changed frequency or mixed frequency on the output conductor 15 which has greatly reduced noise from that which would be accomplished in the original circuit of FIGURE 1. Accordingly, internal noise is greatly attenuated or reduced to provide a more pure intermediate frequency or other changed frequency to reproduce the received intelligence signals in a substantially greatly reduced noise spectrum.

Referring more particularly to FIGURE 3, a pair of semiconductors such as transistors 30 and 31 are coupled to receive signals 1 and 2 on their respective bases to produce a changed or mixed frequency on the output conductor 35. All other elements, 32 through 37, of the circuit correspond to the like elements of FIGURE 2 to produce a frequency changer or mixer circuit for low voltage applications. The resistance element 40 and the capacitor element 41 are coupled in a corresponding manner to those in FIGURE 2 to produce the out-of-phase coupling of noise components which will be attenuated in the semiconductor or transistor 30 thereby minimizing the noise spectrum on the output conductor 35 in the mixed or changed frequency.

While many modifications and changes may be made in the structural details or features of this invention as by using twin triodes or the like, it is to be understood that I desire protection in the spirit and scope of my invention to the extent set out by the scope of the appended claims.

I claim:

1. A low noise frequency changer circuit comprising:
   a pair of triode emission components each having a control electrode and two conduction electrodes, one conduction electrode of each being coupled in common;
   a load coupled to said common coupled conduction electrodes of the pair of triode emission components;
   a load coupled to each of the other conduction electrodes of each triode emission component;
   a voltage supply adaptable to be coupled across the load to said common coupled conduction electrodes and the loads to said other conduction electrodes;
   a capacitive coupling between the other conduction electrode of one of said pair of triode emission components and the control electrode of the other of said pair of triode emission components the capacity of said compacitive coupling being substantially equal to the inherent capacity between the control electrode and the conduction electrode of said other triode emission component;
   one frequency signal to be changed applied to the control electrode of said other of said triode emission components and another frequency signal applied to the control electrode of said one of said triode emission components; and
   an output coupled to the other conduction electrode of said other triode emission component whereby the frequency signal applied to the control electrode of said other triode emission component is changed on the output thereof with a minimum of noise, said noise being minimized by the out-of-phase capacitive and common conduction terminal coupling of said one triode emission component with the other triode emission component.

2. A low noise frequency changer circuit as set forth in claim 1 wherein:
   said triode emission components are vacuum tube triode components and said common coupled conduction electrodes are said tube cathodes.

3. A low noise frequency changer circuit comprising:
   a pair of cathode-coupled triode tubes;
   a cathode load resistor coupling one pole of a voltage source to the commonly coupled cathodes;
   an anode load resistor coupling each anode of each triode tube to the other pole of said voltage source;
   a capacitor coupling the grid of one triode tube to the anode of the other triode tube, said capacitor being of a capacity substantially equal to the inherent capacity between the cathode and grid of said one triode tube;
   an output circuit coupled to the anode of said one triode tube;
   a first frequency signal to be changed coupled by conductor to the grid of said one triode tube; and
   a second frequency signal to be mixed with said first frequency signal coupled by conductor to the grid of said other tube, said second frequency signal producing mixing oscillations with said first frequency signal through said common cathode coupling with noise signals being substantially cancelled in the out-of-phase coupling of said common cathodes and capacitor grid-to-anode coupling whereby the changed first frequency on said output is of low electron emission noise level.

4. A low noise frequency changer circuit as set forth in claim 3 wherein:
   said second frequency signal is from a local oscillator to produce an intermediate frequency on said output.

References Cited by the Examiner

UNITED STATES PATENTS

| | | | |
|---|---|---|---|
| 1,978,446 | 10/34 | Aubert | 325—450 |
| 2,562,311 | 7/51 | Goldberg | 325—442 |

DAVID G. REDINBAUGH, *Primary Examiner.*